US010620237B2

(12) United States Patent
Dearman et al.

(10) Patent No.: US 10,620,237 B2
(45) Date of Patent: Apr. 14, 2020

(54) POWER SUPPLY

(71) Applicant: Quarch Technology Ltd, Highland (GB)

(72) Inventors: Michael Dearman, Highland (GB); Iain Robertson, Highland (GB)

(73) Assignee: QUARCH TECHNOLOGY LTD, Highland (GB)

( * ) Notice: Subject to any disclaimer, the term of this patent is extended or adjusted under 35 U.S.C. 154(b) by 204 days.

(21) Appl. No.: 15/381,296

(22) Filed: Dec. 16, 2016

(65) Prior Publication Data
US 2017/0176498 A1 Jun. 22, 2017

(30) Foreign Application Priority Data
Dec. 16, 2015 (GB) .................................. 1522233.4

(51) Int. Cl.
*G01R 1/20* (2006.01)
*G01R 19/00* (2006.01)
*G05F 1/575* (2006.01)

(52) U.S. Cl.
CPC ......... *G01R 1/203* (2013.01); *G01R 19/0092* (2013.01); *G05F 1/575* (2013.01)

(58) Field of Classification Search
CPC ... G01R 1/203; G01R 15/146; G01R 19/0007
See application file for complete search history.

(56) References Cited

U.S. PATENT DOCUMENTS

| 5,917,331 | A | 6/1999 | Persons |
| 7,276,893 | B2 | 10/2007 | Banaska et al. |
| 2010/0007327 | A1* | 1/2010 | Andoh ............. G01R 31/31924 324/76.11 |

* cited by examiner

*Primary Examiner* — Tung X Nguyen
(74) *Attorney, Agent, or Firm* — Muncy, Geissler, Olds & Lowe, PC

(57) ABSTRACT

A power supply is described having a current measurement circuit connected between a supply voltage terminal and an output voltage terminal of the power supply. The current measurement circuit comprises a set of two or more sense resistors in a parallel configuration, first and second ones of the sense resistors having different impedances. Switching circuitry is provided, which is responsive to a control signal to connect one or more of the sense resistors between the supply voltage terminal and the output voltage terminal. A controller is operable to generate the control signal in dependence on a measured current level across the set of sense resistors. In this way, by switching the resistors in and out of the circuit, the voltage drop across the measurement circuit can be kept to a desired range.

20 Claims, 3 Drawing Sheets

POWER SUPPLY

TECHNICAL FIELD

The present invention relates to a power supply, and to a method of measuring current while supplying power. Embodiments of the present invention may be utilised in power supplies where simultaneous power supply and measurement is required over a large dynamic range.

BACKGROUND

Some electronics applications, such as the testing of disk drives which have sleep and active modes, PCI express cards with sleep modes, or integrated circuits (ICs), require simultaneous power supply and measurement over a large dynamic range. When measuring current via sense resistors, this would require multiple resistors over a wide range of impedances, or the use of extremely sensitive and costly equipment—for example high sensitivity, low noise, Analog to Digital Converters (ADCs) or Amplifiers for measuring currents, and smoothing/averaging techniques to deal with the low signal to noise ratio at low current states.

Circuits which continuously measure current over a large dynamic range, or for power supply and measurement over a large range, are known. However, the limitations of such circuits are such that continuous measurement over the full range is not possible. Also known are alternative methods for smoothing the transition from one dynamic range to another. For example, U.S. Pat. No. 5,917,331 describes a circuit for power supply and measurement, which incorporates a single resistor in use at one time and a "soft" switching method where the measurement circuit is slowly shorted out and reconnected when changing resistors in order to reduce transient voltages. This allows a large dynamic range of current measurements across the operating sense resistor. However, a limitation of this technique is that it does not continuously measure current, because the soft switch means the measurement circuit is bypassed during range switching. It also means that range switching is a slow operation which can limit its usefulness in some applications. It is also a multiplexed system, which can only use one resistor at a time. U.S. Pat. No. 7,276,893 describes a system for switching dynamic ranges for a measurement circuit, with a set of switchable resistors connected in series to change range, in addition to a ramping circuit in order to reduce transients which are introduced during switching. However, while this system uses variable impedance to allow for different dynamic ranges for the measurement circuit, it also uses a ramping circuit to slowly change the impedance, which introduces the same issue of slow switching as for U.S. Pat. No. 5,917,331.

SUMMARY OF THE INVENTION

According to the present invention, there is provided a power supply having a current measurement circuit connected between a supply voltage terminal and an output voltage terminal of the power supply, the current measurement circuit comprising:
  a set of two or more sense resistors in a parallel configuration;
  switching circuitry, responsive to a control signal to connect one or more of the sense resistors between the supply voltage terminal and the output voltage terminal; and
  a controller, operable to generate the control signal in dependence on a measured current level across the set of sense resistors.

While the sense resistors might have the same impedance for some applications, in order to handle a large dynamic range, preferably first and second ones of the sense resistors have different impedances.

Preferably, the power supply comprises a regulator coupled between the sense resistors and the output voltage terminal for controlling the voltage at the output voltage terminal. The regulator may be operable to control the voltage at the output voltage terminal based on a reference voltage. The reference voltage may be a fixed voltage or a variable voltage.

The supply voltage ($V_{supply}$) may be set in dependence on the desired voltage at the output terminal ($V_{out}$), the dropout voltage required by the regulator ($V_{reg}$) and the potential difference ($V_{sense}$) across the highest impedance resistor in the set. For example, the supply voltage may be set in accordance with the following expression:

$$V_{supply} \geq V_{out} + V_{reg} + V_{sense}$$

Preferably, one of the resistors in the set is permanently connected between the supply voltage terminal and the output voltage terminal, and the switching circuitry is operable to connect one or more other resistors in parallel with the permanently connected resistor.

Current measurement circuitry may be connected across the set of sense resistors. The current measurement circuitry may comprise a set of current measurement devices, each current measurement device being connected across one of the sense resistors and being operable to generate a signal level indicative of the current level of the associated resistor. The controller may be operable to generate the control signal in dependence on the signal levels output by the connected ones of the current measurement devices. The current measurement devices may be analog to digital convertors.

Preferably, the controller is operable to control the switching circuitry so as to generally retain the combined current across the set of resistors between a high threshold value and a low threshold value. In order to achieve this, if the combined current exceeds the high threshold value, the controller may be operable to cause the switching circuitry to connect an unconnected one of the resistors between the supply voltage terminal and the output voltage terminal. The resistor connected in response to the combined current exceeding the high threshold value may be the highest impedance unconnected resistor in the set. In other words, as the current requirement increases, lower value resistors are sequentially connected, starting with the unconnected resistor with the highest impedance and then decreasing in impedance as more resistors are added. Similarly, if the combined current drops below the low threshold value, the controller may be operable to cause the switching circuitry to disconnect a connected one of the resistors. The resistor disconnected in response to the combined current dropping below the low threshold value may be the lowest impedance connected resistor. In other words, as the current requirement decreases, resistors are sequentially disconnected, starting with the connected resistor having the lowest impedance and then removing further resistors of increasing impedance as the current continues to drop.

The power supply may comprise analog comparator circuitry for comparing the combined current through the connected ones of the set of resistors with the high threshold value, the controller being responsive to the analog comparator circuitry detecting that the combined current has exceeded the high threshold value to cause the switching circuitry to connect an unconnected one of the resistors between the supply voltage terminal and the output voltage terminal. The controller may be responsive to the signal levels generated by the analog to digital convertors to detect that the combined current has dropped below the low threshold. In other words, the analog comparator may be used to detect when the current has increased above the high threshold, while the analog to digital convertors may be used to detect when the current has dropped below the low threshold.

Preferably, the controller is operable to keep the current passing through the set of resistors within a desired measurement range.

According to another aspect of the invention, there is provided a method of measuring current while supplying power, the method comprising:
providing a set of two or more sense resistors in a parallel configuration;
responsive to a control signal, connecting one or more of the sense resistors between a supply voltage terminal and an output voltage terminal; and
generating the control signal in dependence on a measured current level across the set of sense resistors.

It will be appreciated from the above, and also from the description below, that embodiments of the invention provide a power supply and measurement circuit comprising multiple switchable sense resistors which may be connected in parallel in order to measure a large dynamic range of current via the switching in/out of resistors from the circuit. The switching of resistors may be triggered when the current passing through the presently connected, active sense resistors exceeds or drops below set thresholds. Dips or spikes in voltage would be a problem with conventional switching in and out of resistors, but the present technique addresses this problem by using a regulator which smooths the transitions from one impedance state to another such that a controlled output may be maintained at all times.

Embodiments of the invention may provide a current-measuring power supply circuit, where the use of at least one rapidly-switchable sense resistor in parallel with at least one permanently connected sense resistor, and simple current measurement devices across each resistor, enables current to be measured over a large dynamic range via the switching in/out of resistors to the circuit. Total current can be measured by summing the current at each active sense resistor. However, the step change in impedance which occurs when switches are operated introduces a challenge in producing a consistent voltage output, so the output is controlled by a high speed regulator, which has the ability to alter the output voltage sufficiently rapidly that it can alter the voltage on a timescale which is short enough for the equipment connected to the output to be unaffected by these voltage transients.

The advantages that the invention has over the prior art are that it brings the capability of continuous current measurement over a wide dynamic range, with a consistent supply of voltage. The fast, low impedance switches allow the dynamic range to be changed with no delays added to the measurement process, as is introduced via a soft switch. This allows e.g. continuous testing of equipment over wide and rapidly changing loads, with no abrupt changes in output voltage as the circuit switches dynamic ranges. This enables low cost equipment to be used instead of more sensitive, large range ADCs with continuous measurement—this is not possible using other prior art solutions where the measurement circuit is bypassed during switching. This simple, low cost equipment also allows the invention to be smaller than the alternatives.

As an alternative to the present technique, it is possible to use more sensitive ADCs or high precision variable-gain amplifiers, which will work with very low currents and therefore negate the need for switching resistors in and out. However, this can often result in measuring signals with low signal to noise ratios, which means some form of smoothing/averaging is usually necessary, and therefore slows the rate at which the current can be varied. These devices can also be much more expensive and the circuit is much more complex. Alternatively, current could be measured using current clamps, but these require additional expenditure on the measurement units themselves and may not be sensitive enough for certain applications.

BRIEF DESCRIPTION OF THE DRAWINGS

Embodiments of the present invention will now be described by way of example only with reference to the accompanying drawings where like parts are provided with corresponding reference numerals and in which.

DETAILED DESCRIPTION

Figure 1:
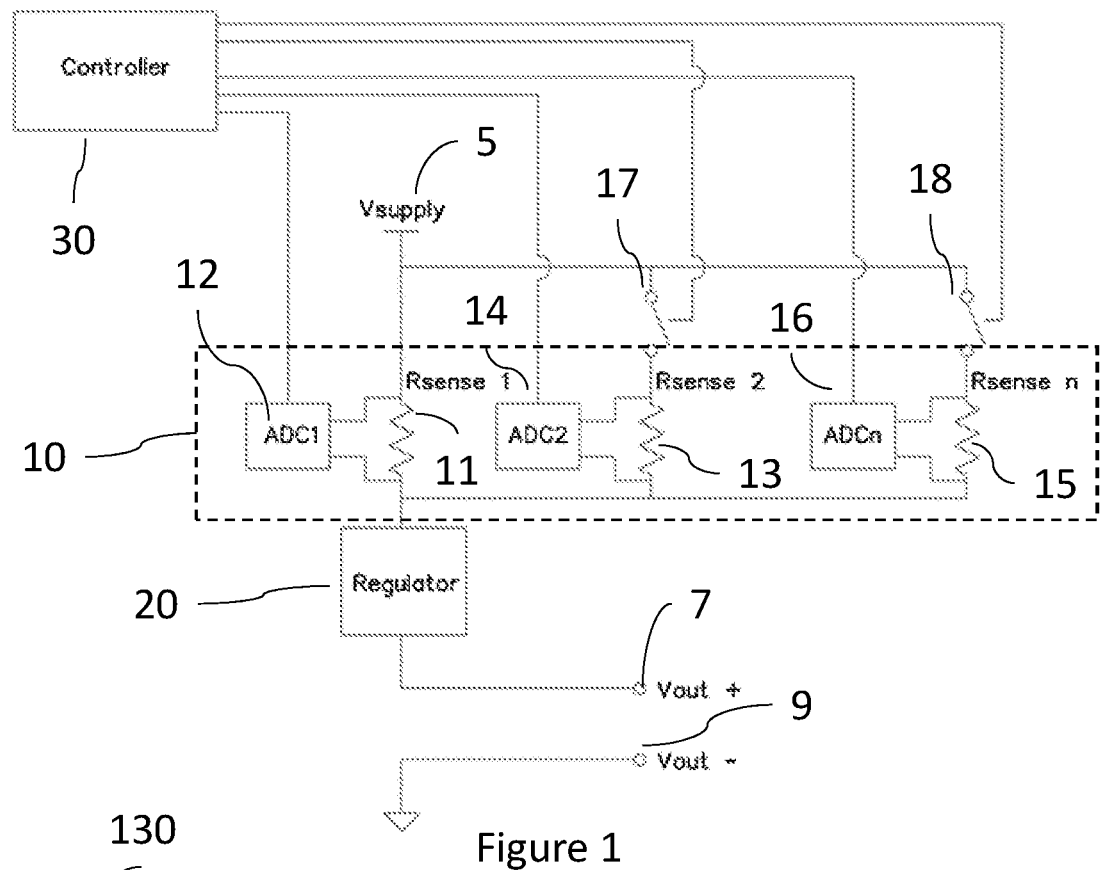
FIG. 1 schematically illustrates a power supply and current measurement circuit according to a first embodiment of the invention.

FIG. 1 shows a circuit for facilitating a method of continuous current measurement over a large dynamic range, whilst simultaneously supplying power at a controlled voltage. In FIG. 1, a supply voltage $V_{supply}$ is provided at a terminal 5 by a power source (not shown), and a measurement circuit 10 and a regulator 20 are provided between the supply voltage terminal and an output terminal 7 at which a positive output voltage $V_{out}+$ is present. A second output terminal 9 provides a negative (or ground) output voltage $V_{out}-$. A controller 30 is provided which both receives the current measurements from the measurement circuit 10 (which may be outputted for display or communication to another device) and also controls the measurement circuit 10 by way of controlling a switch 17 and a switch 18 (referred to generally as switching circuitry). One example of a suitable switch is the IRF IRLR8259PBF 57A N Channel FET. The measurement circuit 10 comprises a fixed sense resistor 11 ($R_{sense}1$) which is permanently connected in an electrical path between the terminal 5 and the terminal 7, a first switchable sense resistor 13 ($R_{sense}2$) which can be connected or disconnected from the electrical path between the terminal 5 and the terminal 7 by the switch 17, and an nth switchable sense resistor 15 ($R_{sense}n$) which can be connected or disconnected from the electrical path between the terminal 5 and the terminal 7 by the switch 18. It should be understood that in one alternative embodiment only a single fixed resistor and a single switchable resistor could be provided. In another alternative embodiment more than two switchable resistors could be provided in addition to the fixed resistor. It will be further appreciated from FIG. 1 that the resistors 11, 13, 15 are provided in a parallel configuration. In particular, when the first switchable resistor 13 is active, by way of the switch 17 being closed, then the resistor 13 and the resistor 11 are connected in parallel. Similarly, when the nth switchable resistor 15 is active, by way of the switch 18 being closed, then the resistor 15 and the resistor 11 (and optionally the resistor 13, if the switch 17 is closed) are connected in parallel.

The current measurement circuit 10 does not directly measure the current passing through it, but instead measures the voltage drop across the one or more currently connected resistors. The measured voltage drops across the resistors (which although in parallel may be slightly different due to the fact that the switches 17 and 18 themselves provide some resistance on the current paths passing through the resistors 13 and 15) together with the known impedance values of the currently connected resistors can be used together to determine the current passing through the current measurement circuit 10. The voltage drop across the resistor 11 is measured by an analog to digital convertor (ADC) 12. Similarly, the voltage drop across the resistor 13 is measured by an ADC 14 and the voltage drop across the resistor 15 is measured by an ADC 16. These ADCs are able to measure a voltage drop within a particular voltage range. If the current through the measurement circuit increases or decreases dramatically, this will result in a large change in the voltage drop across the measurement circuit 10. For example, if the current increases dramatically, then the voltage drop across the measurement circuit 10 will also increase dramatically. This may result in the voltage drop being outside the measurement range of the ADCs connected to the currently connected resistors. If on the other hand the current decreases dramatically, then the voltage drop across the measurement circuit 10 will also decrease dramatically. This may result in the voltage drop using only a very small portion of the measurement range of the ADCs connected to the currently connected resistors, in turn resulting in a loss of measurement resolution. In order to address this problem, the controller 30 is responsive to a change in current (or more particularly a change in voltage drop across the resistors) to trigger the switches 17, 18 to connect or disconnect the switchable resistors 13, 15 to compensate. In particular, if the current through the measurement circuit 10 suddenly increases, resulting in an increase in the voltage drop across the measurement circuit 10, one or more additional resistors is connected between the supply voltage terminal 5 and the output voltage terminal 7. This reduces the resistance of the measurement circuit 10, which in turn reduces the voltage drop across the measurement circuit 10, bringing the voltage drop back into the measurement range of the ADCs associated with the currently connected resistors. Similarly, if the current through the measurement circuit 10 suddenly decreases, resulting in a reduction in the voltage drop across the measurement circuit 10, one or more currently connected resistors is disconnected from between the supply voltage terminal 5 and the output voltage terminal 7. This increases the resistance of the measurement circuit 10, which in turn increases the voltage drop across the measurement circuit 10 to utilise a greater portion of the measurement range of the ADCs associated with the currently connected resistors, increasing accuracy and reducing the influence of noise. One example of a suitable ADC is the Linear Technology LTC2361 12 bit 250 KS/s ADC.

In order to cope with a large dynamic range, the resistors 11, 13 and 15 can be expected to have different impedances. For example, the fixed resistor 11 may be a Panasonic ERJ1TRQF2R7U 2.7 ohm resistor, while the switchable resistor 13 may be a Welwyn ULR2-R002FT2 0.02 ohm resistor. In other words, the impedance of the switchable resistor 13 may be one or more (in this case two) orders of magnitude lower than that of the fixed resistor 11. Similarly, the impedance of the nth switchable resistor 15 may be one or more orders of magnitude lower than that of the first switchable resistor 13. As a result, if the resistors are activated (connected by the switches 17 and 18) in sequence, the total impedance of the current measurement circuit will decrease dramatically as each additional resistor is connected, resulting in the voltage drop across the current measurement circuit also decreasing dramatically at each step. It will be appreciated that the overall impedance of the current measurement circuit is dominated by the resistor having the lowest impedance, and so the fixed resistor 11 can be expected to have the highest impedance, while each successive resistor in the set (in the present case the resistor 13 and then the resistor 15) can be expected to have an impedance one or more orders of magnitude lower than the previous resistor.

It will be appreciated from the above that currents are measured across a set of rapidly switchable parallel sense resistors using ADCs. Power is produced by a power source, which is connected to the first sense resistor 11. This first sense resistor 11 has at least one sense resistor 13, 15 connected in parallel across it, and each sense resistor has its own ADC 12, 14, 16 and a switch 17, 18. These feed their measurements back to the controller 30, which uses a process to be described below with reference to FIG. 3 to operate the switches and keep the measured current within a desired range. The resistance or measurement circuit 10 is then connected to a regulator 20 which rapidly adjusts the voltage to absorb the voltage transients from switch operations and control the voltage $V_{out}$.

This technique uses current sensing across multiple parallel sense resistors to measure load currents. Because voltage is the product of current and resistance, using a low value resistor in series with a load, it is possible to measure the load current by measuring the voltage across the resistor. The larger the voltage dropped across the resistor, the easier it is to measure the current (a larger voltage requires less sensitive amplifiers). However, a large voltage drop is not desirable as it means greater energy is expended in the resistor, which leads to a less efficient power supply and increases the risk that the resistor may burn out. However, low voltage drops can result in the current measuring devices detecting only a small signal which will increase the risk of noise-dominated measurements. Measuring current over a large dynamic range using only one resistor is therefore challenging, thus a range of resistors with different impedances is better suited. The present technique utilises a large dynamic range power supply and measurement circuit. This large dynamic range is created via the use of a range of impedances, which itself is achieved using a number of switchable resistors in parallel with a permanent resistor, where the switchable resistors are of different impedances. Switching is performed by high speed, low impedance switches so as to prevent range-switching from impacting the ability to measure current and to prevent increasing the total impedance in the circuit.

Figure 2:
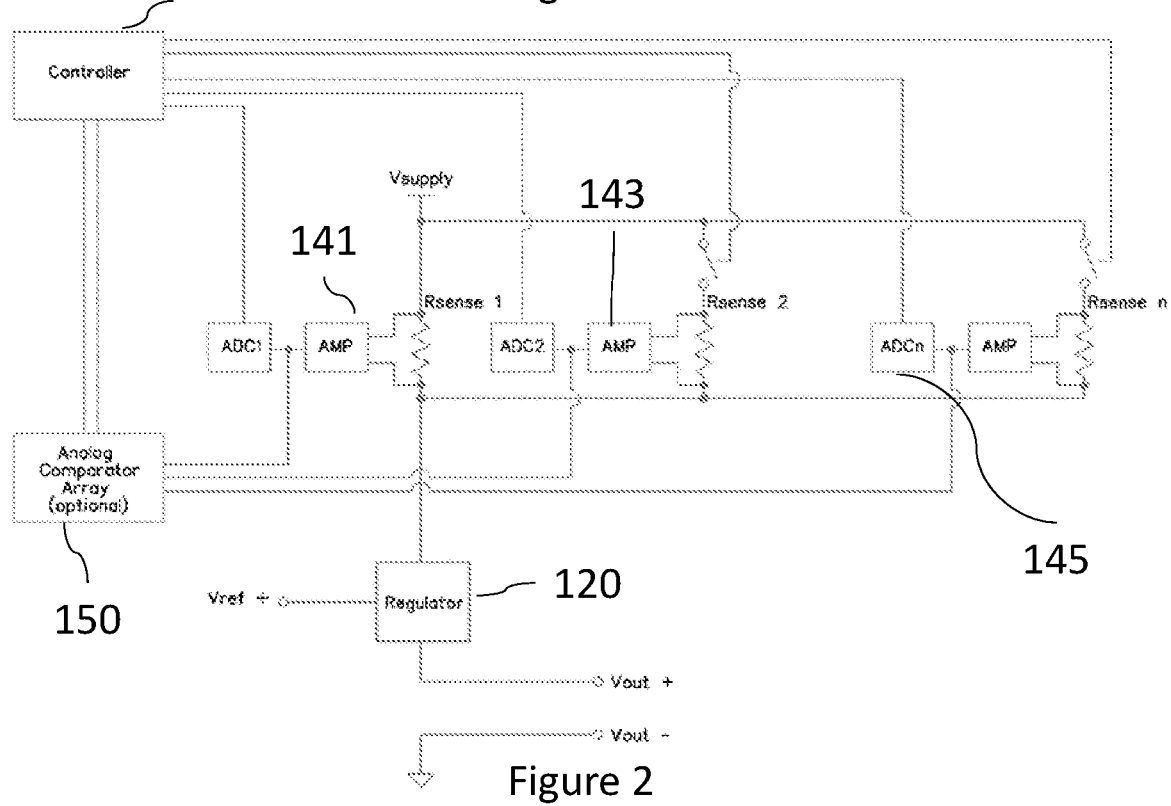
FIG. 2 schematically illustrates a power supply and current measurement circuit according to a second embodiment of the invention.

In practice, low speed ADCs may not relay the change in current to the controller 30 fast enough for it to respond to large current changes. In particular, if the circuit does not switch to higher current modes fast enough, excessive current may flow through the sense resistors leading to a momentary drop in voltage and excessive power dissipation in the sense resistors. In order to address this problem, FIG. 2 schematically illustrates an alternative to the circuit of FIG. 1, in which an analog comparator is used to more rapidly detect changes in current. For the sake of clarity and brevity, the supply voltage terminal, the positive output voltage terminal, the negative output terminal, the switches, the sense resistors and the ADCs all correspond to the components 5, 7, 9, 17, 18, 11, 13, 15, 14, 16, 18 of FIG. 1 and are not labelled in FIG. 2, and will not be described in detail again with reference to FIG. 2. In FIG. 2, an analog comparator array 150 is used to sense increased demand for current without having to change the ADCs 12, 14, 16 from those in FIG. 2. In order that the voltage level across the sense resistors is large enough to be measured, amplifiers 141, 143, 145 are provided across the respective sense resistors. An example of a suitable amplifier is the Analog Devices AD8421 Current Amplifier. The amplified voltage drops across the sense resistors are compared with a threshold value by an analog comparator within the array 150. In practice, it is only necessary to compare the voltage drop across the presently dominant (lowest impedance) resistor. For example, in the case of the 3 resistors 11, 13, 15, if only the resistor 11 is initially connected, the measured voltage drop across the resistor 11 is used to determine when to switch the resistor 13 on. When the resistor 11 and the resistor 13 are enabled, only the voltage drop across the resistor 13 is compared with a threshold, allowing for the fact that it is in parallel with 11. It will be appreciated that each of the comparators in the array uses its own threshold value, which can be expected to be different from the threshold values used by other comparators in the array. In order to keep the comparator array 150 as simple as possible, the analog comparator array 150 is only used to detect when the current has increased such that an additional resistor needs to be connected. For current increases, the rapid response of the analog comparator array 150 is significant. In contrast, where the current decreases, a slower response time for switching is acceptable, and as a result the ADC outputs can be used by the controller 130 to trigger the disconnection of resistors from the circuit when the current drops. It will be appreciated that, if comparators are only being used to inform a decision to connect an additional resistor, the number of comparators required will be one less than the number of resistors in the set. In the case of a two resistor set (one fixed and one switchable) only a single analog comparator is required. Also shown in FIG. 2, the voltage regulator 120 is supplied with a reference voltage, which remains flexible and could be either a constant fixed voltage or could change as a function of time—for example a sinusoidal wave, or constantly increasing, in order to vary the output voltage $V_{out}$ for a particular application. As with FIG. 1, the voltage regulator 120 absorbs voltage fluctuations resulting from the operation of the switches.

Figure 3:
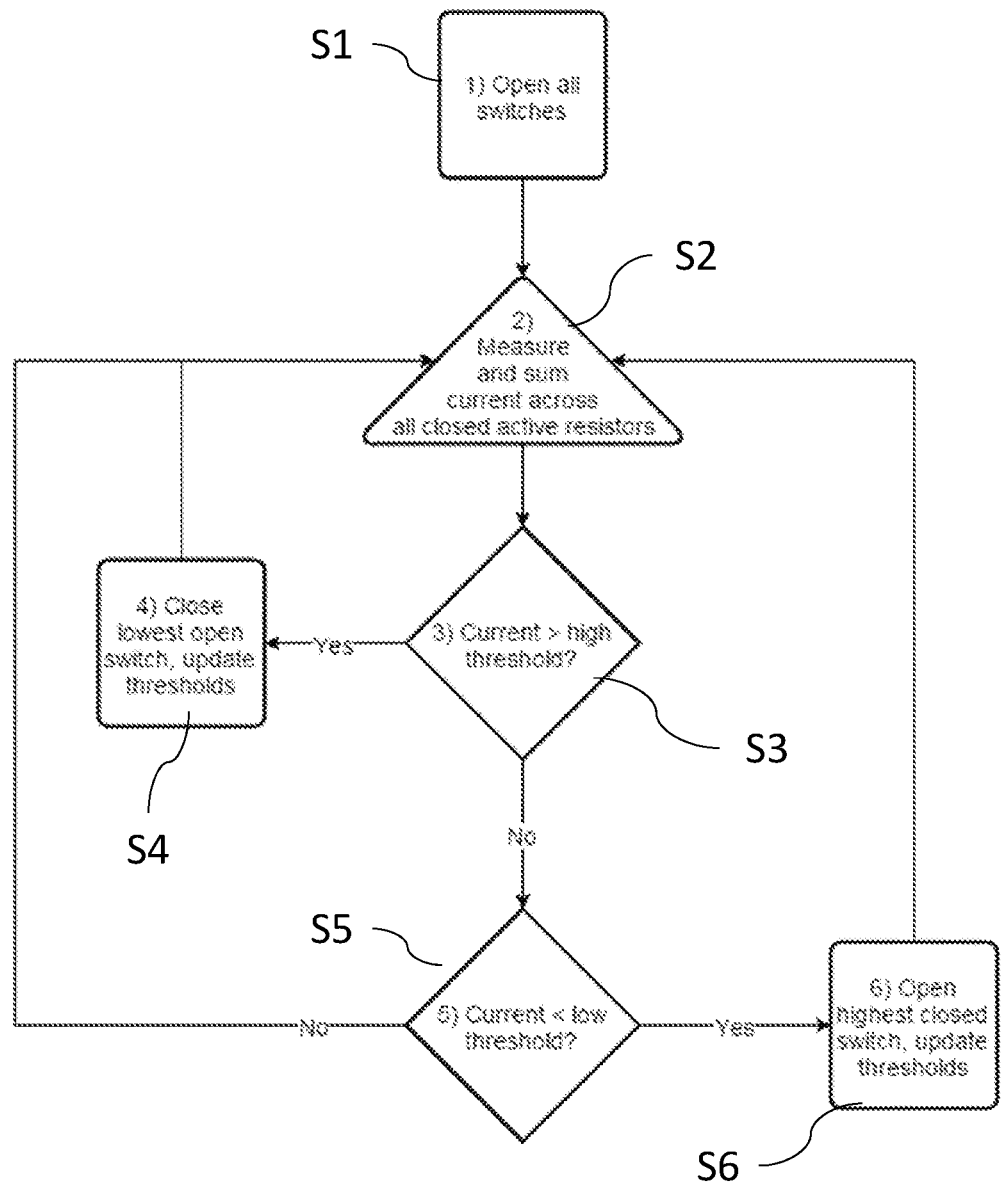
FIG. 3 schematically illustrates a control process for maintaining current within a desired range.

Referring now to FIG. 3, a process by which the combined current through the measurement circuit 10 is kept generally within a high and a low threshold via the switching of impedances is shown. In particular, the controller 30, 130 operates the switches 17, 18, such that currents are kept generally between a high and a low threshold via the process shown in the flow chart of FIG. 3, where resistors are switched in and out iteratively until current is within the correct range. At a step S1, the circuit's initial state is with all switches open. At a step S2, the current is measured across all the active resistors (initially, just the permanent resistor) and summed. The total current is then (in addition to forming a measurement output of the present current level) compared to the high threshold at a step S3, and if it is greater than the high threshold, the lowest open switch is closed and thresholds updated at a step S4. It should be understood that the upper threshold and the lower thresholds change in dependence on the switching state (or in other words, in dependence on which resistors are currently connected). When only the resistor 11 is connected, the upper threshold for triggering the connection of the resistor 13 may be, say 80 mA. As a result, when deciding whether to trigger the connection of the resistor 15, a new upper threshold (say 10 A) should be used. Similarly, on the way down, the lower threshold might be 2 A while all three resistors 11, 13, 15 are connected (substantial hysteresis is built into the circuit by the difference between the upper and lower thresholds), but when the resistor 15 is disconnected, the lower threshold for disconnecting the resistor 13 may be 10 mA for example. It is for this reason that the thresholds require updating in the event of a transition at the step S4. It will be understood that closing the lowest open switch will connect the highest impedance unconnected resistor into the circuit, decreasing the total impedance of the measurement circuit 10, 110 and reducing the voltage drop across the measurement circuit 10. Then, current measurements are made again, returning to the step S2. If the current was less than the high threshold at the step S3, the system compares the current to the low threshold at a step S5. If the current is below the low threshold, then the highest closed switch is opened at a step S6 (and the thresholds are updated, as described above), and current measurements are made again at the step S2. It will be understood that opening the highest closed switch will disconnect the lowest impedance connected resistor from the circuit, increasing the total impedance of the measurement circuit 10 and increasing the voltage drop across the measurement circuit 10. If the current was within both thresholds, then the system measures current again (at the step S2) without operating any of the switches. Using switches allows the dynamic range to be changed rapidly, as opposed to using smoothed transitions seen in previous techniques which would impact on the current measurements during transitions.

When the switches are operated, the circuit will undergo a near-instantaneous change in impedance. Consequently, the output voltage will sharply increase when total impedance is reduced and vice versa for an increase in impedance. For the output of a power supply, this can be problematic as devices connected to the output may be sensitive to such changes in voltage. The present technique addresses these issues via the use of the high speed regulator 20, 120 between the resistors and the power output, which is able to adjust the voltage sufficiently rapidly as to absorb voltage transients when resistors are turned on/off and therefore cause no adverse effects on the measurements, or the device connected to the output. The supply voltage should be set at a value which is greater than the output voltage by at least the largest voltage drop expected to be seen in the system, that is:

$$V_{supply} \geq V_{out} + V_{reg} + V_{sense}$$

where $V_{supply}$ is the voltage supplied to the measurement circuit, $V_{out}$ is the final output voltage, $V_{reg}$ is the dropout voltage required by the regulator and $V_{sense}$ is the potential difference across the highest impedance sense resistor in the circuit. $V_{reg}$ is a fixed value determined by the regulator technology in use, $V_{sense}$ is determined by the highest current expected to pass through the highest impedance sense resistor, $V_{out}$ is determined by reference voltage $V_{ref}$ (which can be constant or a function of time).

Figure 4:
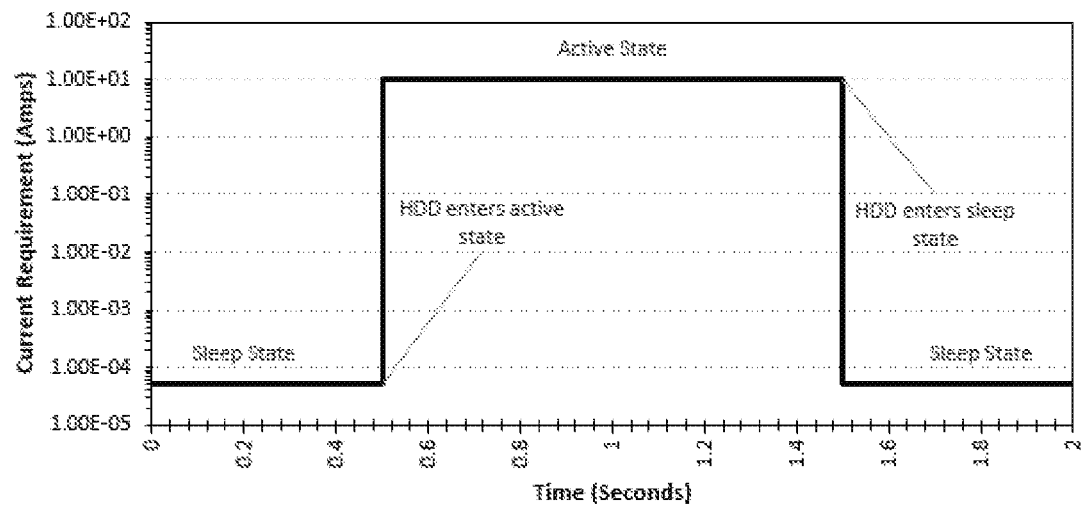
FIG. 4 schematically illustrates the current requirements over time of a hard disk drive switching between a low power state and a high power state.
Figure 5:
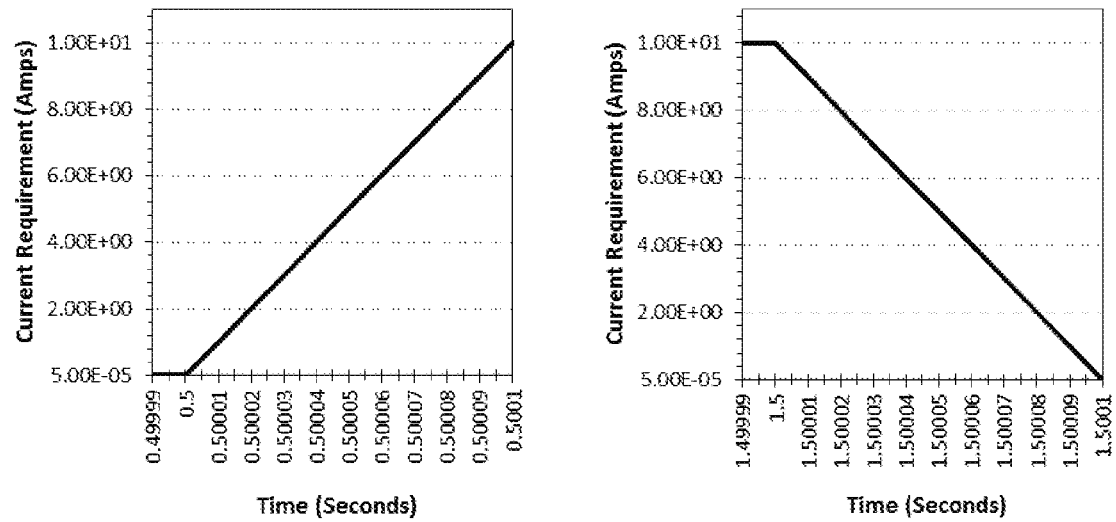
FIG. 5 schematically illustrates the change in current requirements at the transition points in FIG. 4.

In one example use case, the circuits described above may be used for monitoring current during testing of a hard disk drive undergoing transitions into and out of a sleep state. In this case, the output terminals 7, 9 are connected to a Hard Disk Drive (HDD), which has a low-power sleep state plus a high-power operational state. The difference in power requirement may be six orders of magnitude, and require a constantly increasing/decreasing current from 50 μA to 10 A over a period of 100 μs during the transition to an active/sleeping state respectively. The current requirements of the awaking and sleeping HDD are shown in FIGS. 4 and 5. As a result of this wide range in current requirements, the measurement circuit will go through a range of states depending on the mode of operation of the HDD. When the HDD is in the sleep state (0-0.5 seconds in FIG. 4), the circuit will draw very little current, which means that the measurement circuit will iterate through steps S2 to S6 of FIG. 3, changing switch states to retain the current level across the resistors to a level which is within an optimum operating range of the ADCs. At 0.5 s the HDD switches to an active state, so from 0.5 to 0.5001 seconds the dynamic range will require changing as the current ramps up from 50 μA to 10 A over this 100 μs period. This means the dynamic range will be changing from sensitivity on the ~0.00001 amp scale to the ~10 amp level. Therefore as current increases, the circuit will iteratively close the lowest open switch (steps S2, S3, and S4 of FIG. 3) in order to control the dynamic range. As the current remains stable from 0.5001 to 1.5 seconds, the circuit will loop through steps S2, S3, and S5 of FIG. 3, until the current begins decreasing (1.5-1.5001 seconds) due to the HDD switching to the sleep state at 1.5 s. This means the circuit will iterate through steps S2, S3, S5 and S6 of FIG. 3, and iteratively open the highest closed switch in order to control the measurement thresholds. The HDD remains in the sleep state for the remainder of the 2 second test, so the switches will remain in the same state for this time period while the controller iterates through steps S2, S3, and S5 of FIG. 3.

There are a number of possible options which may or may not be utilised, depending on the implementation:

Current Measurement Devices

The example embodiments use ADCs, but it would be possible to use any voltage sensitive device across the resistors, as demonstrated in FIG. 2 where a comparator array is also used. While the present technique is aimed at enabling the use of simple equipment for current measurements, more sensitive equipment such as high speed ADCs or any means of measuring current through the resistors would still work in this application. Alternatively, the technique could be used with impedance based sensors (such as fluid flow sensors), where using sensors in parallel will reduce the impact of the impedance on their effective range. It would also be possible to implement the multi resistor circuit with only one ADC (reducing component cost and simplifying the circuit), which is placed across the permanent resistor. The disadvantage of doing this is that the impedance and temperature coefficient of the switches will have an effect on overall measurement accuracy. Using one ADC for every resistor prevents this from being an issue, as the voltage across the switches is therefore not taken into account in the measurement.

Number of Resistors

A large dynamic range can require a large range of switchable impedances in parallel, but this number is specific to the application and need not be fixed, with the only constraint being a minimum of 2 resistors (one which is preferably permanent, plus one switchable resistor connected in parallel across the permanent resistor). It is preferable that one permanently connected resistor be provided because power needs to be supplied/measured continuously. The actual number of resistors is dependent on the impedance range of the resistors and the dynamic range required by the current measuring equipment and application of the device.

Regulator

The regulator should be able to change voltage sufficiently quickly to suppress transients during switching. The speed constraint depends on the application, and need not be fixed at a global value. The regulator should be capable of adjusting output via a reference voltage, which may be either constant or varying as a function of time. The regulator could be either a linear or switching regulator, implemented using either analogue or digital circuitry. The regulator could be placed on the high side of the Sense resistors (so $V_{supply}$ goes straight into the regulator, then the output of the regulator goes into the sense resistors) with the feedback signal still connected to 7 $V_{out}$. This would be advantageous because in the described embodiments the current lost through the regulator is being measured as well (which may be calibrated out at a later stage). The disadvantage of this is that the common mode voltage across the sense resistors may vary, which may affect the accuracy of the measurement, and this configuration may be less stable and/or less effective at reducing the transient voltages during switching.

Controller

This automatically operates the switches in order to control the current. It could be implemented in either digital or analogue circuitry.

Switches

The switches should be of low impedance, high speed and capable of being operated by the controller such that the impedance can be rapidly fine-tuned.

Reference Voltage

An arbitrary voltage, either constant or time-varying, can be used to fine tune the output voltage $V_{out}$, and may be dependent upon the application.

Whilst a motivation for the present technique was to enable the use of simple current measurement devices such as low resolution ADCs, the application of the circuit is not limited to these and would function if other methods were used to measure the voltage across the sense resistors, such as high resolution ADCs, or Analogue circuitry. All circuit components such as the controller and/or the regulator may be implemented in either analogue or digital circuitry.

The present technique was principally aimed at testing electronics which have a sleep state and an active state, where the two states have very different power demands. This includes applications with large power demands. One of the important points of this technique, is its ability to simultaneously supply and measure power, which means that any application which requires this capability, such as for education, is suited and it need not be limited to electronics testing. The invention also has relevance to applications using sensors, such as flow sensors, where the sensor's impedance can reduce its effective range. Using these impedance-based sensors in switchable parallel portions of a circuit will increase the dynamic range over which measurements can be made.

The invention claimed is:

1. A power supply having a current measurement circuit connected between a supply voltage terminal and an output voltage terminal of the power supply, the current measurement circuit comprising:

a set of two or more sense resistors in a parallel configuration;

switching circuitry, responsive to a control signal, to electrically connect a plurality of the sense resistors in parallel between the supply voltage terminal and the output voltage terminal;

a controller, operable to generate the control signal in dependence on a measured current level through the set of sense resistors; and a regulator coupled between the sense resistors and the output voltage terminal for controlling the voltage at the output voltage terminal.

2. The power supply according to claim 1, where at least first and second ones of the sense resistors have different impedances.

3. The power supply according to claim 1, wherein the regulator is operable to control the voltage at the output voltage terminal based on a reference voltage.

4. The power supply according to claim 3, wherein the reference voltage is a fixed voltage or a variable voltage.

5. The power supply according to claim 1, wherein the supply voltage ($V_{supply}$) is set in dependence on the desired voltage at the output terminal ($V_{out}$), the dropout voltage required by the regulator ($V_{reg}$) and the potential difference ($V_{sense}$) across the highest impedance resistor in the set.

6. The power supply according to claim 5, wherein the supply voltage is set in accordance with the following expression:

$$V_{supply} \geq V_{out} + V_{reg} + V_{sense}$$

7. The power supply according to claim 1, wherein one of the resistors in the set is permanently connected between the supply voltage terminal and the output voltage terminal, and the switching circuitry is operable to connect one or more other resistors in parallel with the permanently connected resistor.

8. The power supply according to claim 1, comprising current measurement circuitry connected across the set of sense resistors.

9. A power supply having a current measurement circuit connected between a supply voltage terminal and an output voltage terminal of the power supply, the current measurement circuit comprising:

a set of two or more sense resistors in a parallel configuration;

switching circuitry, responsive to a control signal, to electrically connect a plurality of the sense resistors in parallel between the supply voltage terminal and the output voltage terminal;

a controller, operable to generate the control signal in dependence on a measured current level through the set of sense resistors; and current measurement circuitry connected across the set of sense resistors, wherein the current measurement circuitry comprises a set of current measurement devices, each current measurement device being connected across one of the sense resistors and being operable to generate a signal level indicative of the current level of the associated resistor.

10. The power supply according to claim 9, wherein the controller is operable to generate the control signal in dependence on the signal levels output by the connected ones of the current measurement devices.

11. The power supply according to claim 9, wherein the current measurement devices are analog to digital convertors.

12. The power supply according to claim 1, wherein the controller is operable to control the switching circuitry so as to generally retain the combined current across the set of resistors within a predetermined range.

13. A power supply having a current measurement circuit connected between a supply voltage terminal and an output voltage terminal of the power supply, the current measurement circuit comprising a set of two or more sense resistors in a parallel configuration;

switching circuitry, responsive to a control signal, to electrically connect a plurality of the sense resistors in parallel between the supply voltage terminal and the output voltage terminal; and a controller, operable to generate the control signal in dependence on a measured current level through the set of sense resistors, wherein the controller is operable to control the switching circuitry so as to generally retain the combined current across the set of resistors within a predetermined range, wherein if the current across the set of resistors exceeds a high threshold value, the controller is operable to cause the switching circuitry to connect an unconnected one of the resistors between the supply voltage terminal and the output voltage terminal and/or if the current drops below the low threshold value, the controller is operable to cause the switching circuitry to disconnect a connected one of the resistors.

14. The power supply according to claim 13, wherein the resistor connected in response to the current exceeding the high threshold value is the highest impedance unconnected resistor.

15. The power supply according to claim 13, wherein the resistor disconnected in response to the current dropping below the low threshold value is the lowest impedance connected resistor.

16. A power supply having a current measurement circuit connected between a supply voltage terminal and an output voltage terminal of the power supply, the current measurement circuit comprising:

a set of two or more sense resistors in a parallel configuration;

switching circuitry, responsive to a control signal, to electrically connect a plurality of the sense resistors in parallel between the supply voltage terminal and the output voltage terminal; and a controller, operable to generate the control signal in dependence on a measured current level through the set of sense resistors, wherein the controller is operable to control the switching circuitry so as to generally retain the combined current across the set of resistors within a predetermined range, the power supply comprising analog comparator circuitry for comparing the combined current through the connected ones of the set of resistors with a high threshold value, the controller being responsive to the analog comparator circuitry detecting that the combined current has exceeded the high threshold value to cause the switching circuitry to connect an unconnected one of the resistors between the supply voltage terminal and the output voltage terminal.

17. A power supply having a current measurement circuit connected between a supply voltage terminal and an output voltage terminal of the power supply, the current measurement circuit comprising:

a set of two or more sense resistors in a parallel configuration;

switching circuitry, responsive to a control signal, to electrically connect a plurality of the sense resistors in parallel between the supply voltage terminal and the output voltage terminal; and a controller, operable to generate the control signal in dependence on a measured current level through the set of sense resistors, wherein the current measurement devices are analog to digital convertors, and wherein the controller is responsive to the signal levels generated by the analog to digital convertors to detect that the current has dropped below the low threshold.

18. The power supply according to claim 1, wherein the controller is operable to keep the current passing through the set of resistors within a desired measurement range.

19. A method of measuring current while supplying power, the method comprising:

providing a set of two or more sense resistors in a parallel configuration;

responsive to a control signal, electrically connecting a plurality of the sense resistors in parallel between a supply voltage terminal and an output voltage terminal; and generating the control signal in dependence on a measured current level through the set of sense resistors; and controlling the voltage at the output voltage terminal using a regulator coupled between the sense resistors and the output voltage terminal.

20. The power supply according to claim 16, wherein the controller is responsive to the signal levels generated by the analog to digital convertors to detect that the current has dropped below the low threshold.

\* \* \* \* \*